United States Patent [19]
Suzuki

[11] Patent Number: 5,925,445
[45] Date of Patent: Jul. 20, 1999

[54] PRINTED WIRING BOARD

[75] Inventor: Motoji Suzuki, Tokyo, Japan

[73] Assignee: NEC Corporation, Tokyo, Japan

[21] Appl. No.: 08/892,229

[22] Filed: Jul. 14, 1997

Related U.S. Application Data

[30] Foreign Application Priority Data

Jul. 12, 1996 [JP] Japan ..................................... 8-183478

[51] Int. Cl.⁶ ................................. B32B 3/00; H05K 7/02
[52] U.S. Cl. .......................... 428/209; 428/901; 174/250; 174/260; 174/261; 257/725; 257/738; 257/778; 361/760; 361/777; 361/779; 361/782
[58] Field of Search ............................ 428/209; 361/760, 361/777, 779, 782; 174/260, 261, 258, 250; 257/723, 738, 778

[56] References Cited

U.S. PATENT DOCUMENTS

| | | | |
|---|---|---|---|
| 3,561,107 | 2/1971 | Best et al. | 257/778 |
| 3,704,164 | 11/1972 | Travis | 428/209 |
| 3,811,183 | 5/1974 | Celling | 257/778 |
| 4,610,910 | 9/1986 | Kawamoto et al. | 428/209 |
| 4,847,003 | 7/1989 | Palanisamy | 428/209 |
| 4,925,723 | 5/1990 | Bujatti et al. | 428/209 |
| 5,153,051 | 10/1992 | Dorinski | 428/209 |
| 5,493,075 | 2/1996 | Chong et al. | 174/261 |
| 5,512,712 | 4/1996 | Iwata et al. | 174/258 |
| 5,545,465 | 8/1996 | Gaynes et al. | 428/209 |
| 5,550,325 | 8/1996 | Matsuda | 174/250 |
| 5,576,869 | 11/1996 | Yoshida | 361/779 |
| 5,578,874 | 11/1996 | Kurogi et al. | 257/778 |
| 5,608,262 | 3/1997 | Degani et al. | 257/723 |
| 5,656,862 | 8/1997 | Papathomas et al. | 257/778 |
| 5,672,913 | 9/1997 | Baldwin et al. | 257/738 |
| 5,674,595 | 10/1997 | Busacco et al. | 428/209 |
| 5,703,406 | 12/1997 | Kang | 257/778 |
| 5,744,224 | 4/1998 | Takeuchi et al. | 428/209 |

FOREIGN PATENT DOCUMENTS

| | | |
|---|---|---|
| 62-60293 | 3/1987 | Japan . |
| 394437 | 4/1991 | Japan . |
| 4116943 | 4/1992 | Japan . |
| 4148538 | 5/1992 | Japan . |

*Primary Examiner*—Deborah Jones
*Assistant Examiner*—Cathy F. Lam
*Attorney, Agent, or Firm*—Sughrue, Mion, Zinn, Macpeak & Seas, PLLC

[57] ABSTRACT

The present invention provides a printed wiring board on which a bear chip is bonded in face-down. The printed wiring board has wiring patterns extending over the printed wiring board, wherein a plurality of wirings are provided which extend radially and outwardly from a center area of the printed wiring board, and wherein each of the wirings comprises at least a bear chip mounting pad region for contacting bumps of the bear chip, at least an external wiring pad region for connecting to an external wiring, and at least a covered region being covered by at least an insulation layer and the covered region separating between the bear chip mounting pad region and the external wiring pad region and a sealing material is filled within a space defined between the printed wiring board and the bear chip.

16 Claims, 5 Drawing Sheets

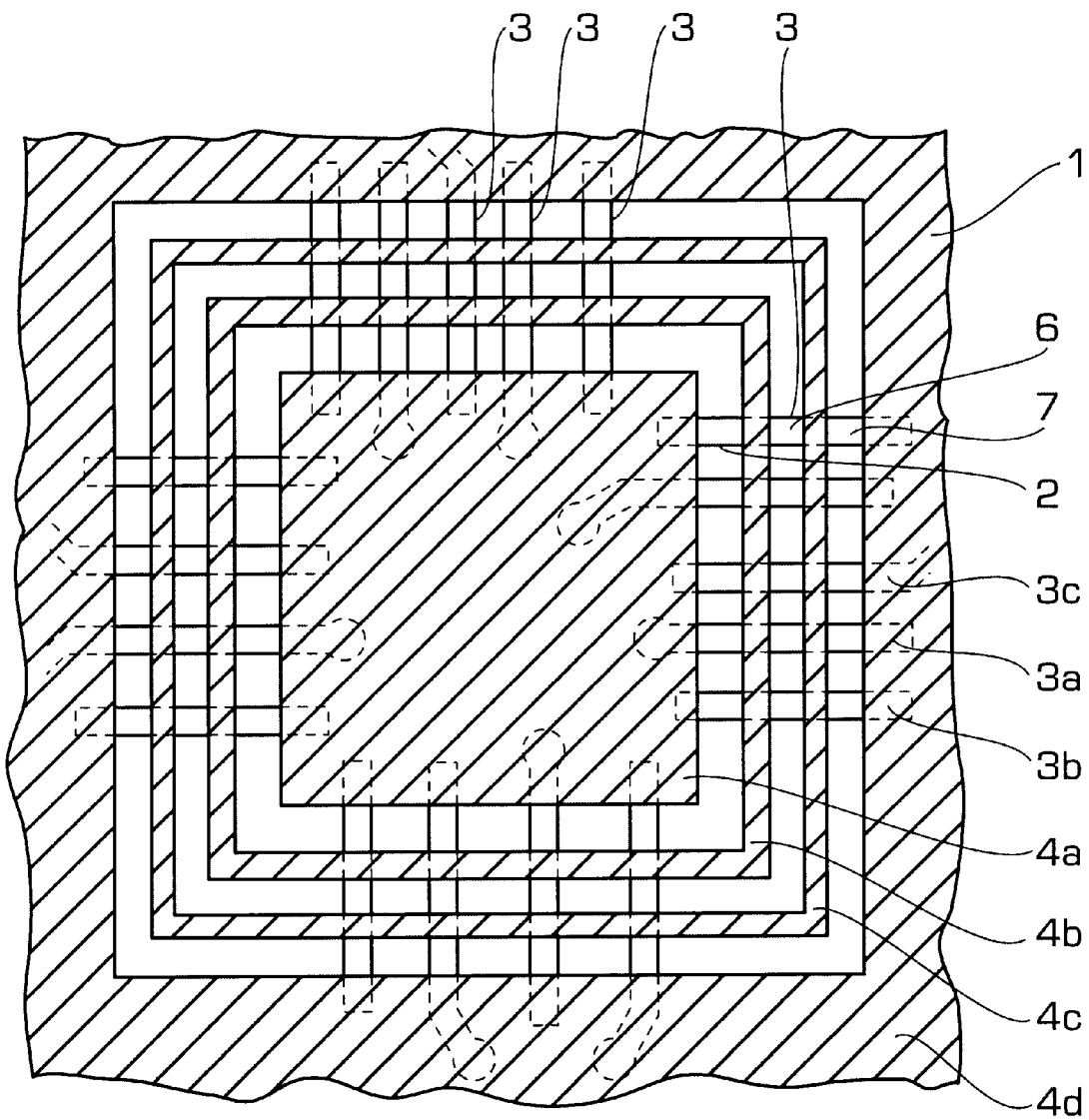

PRINTED WIRING BOARD

BACKGROUND OF THE INVENTION

The present invention relates to a printed wiring board, and more particularly to a printed wiring board to be connected with bump electrodes of a bare chip such as LSIs.

In prior art, a flip chip bonding has been used to mount a bare chip such as LSIs on a printed circuit board. In the flip chip bonding, a bare chip is bonded in face-down via bump electrodes thereof onto the printed circuit board so that the bump electrodes and various devices integrated on the bear chip face to the printed circuit board.

FIG. 1 is a fragmentary cross sectional elevation view illustrative of a structure of the conventional flip chip bonding. A bare chip 58 is mounted in face-down on a printed wiring board 51. The bare chip 58 has a face on which a plurality of bump electrodes 59 are provided. The printed wiring board 51 has a face on which bare chip mounting pads 52 are provided. An insulation film 54 extends over the surface of the printed wiring board 51 and the bare chip mounting pads 52 partially. Parts of the bare chip mounting pads 52 are not covered by the insulation film 54. The bare chip 58 is mounted in face-down on the printed wiring board 51 so that the bump electrodes 59 of the bare chip 58 are made into contact directly with the bare chip mounting pads 52 of the printed wiring board 51, whilst a space is formed between the bare chip 58 and the printed wiring board 51. The space is filled with a sealing resin 60.

As well illustrated in FIG. 1, the bare chip mounting pads 52 are covered by the bare chip 58, for which reason it is difficult to modify the wirings (not shown )extending to the bare chip mounting pads 52 in accordance with the requirement for modification to the logic design appeared after electronic devices have been mounted.

In the Japanese laid-open patent publication No. 62-60293, in order to overcome the above problems, it was proposed to a printed wiring board 61 as illustrated in FIGS. 2A and 2B. FIG. 2A is a plane view illustrative of the printed wiring board. FIG. 2B is a plane view illustrative of the printed wiring board on which an electronic device is mounted. In FIG. 2A, a plurality of mounting pads are aligned over the printed wiring board 61. Each of the mounting pads comprises a contact pad 62 and a wiring pad 63, both of which are unitary formed and the contact pad 62 is positioned inside and the wiring pad 63 is positioned outside. As illustrated in FIG. 2B, the electronic device 64 is mounted on the contact pads 62. Therefore, the wiring pads 63 are not covered by the electronic device 64. It is easy to connect the wirings to the wiring pads 63. The contact pads 62 and the wiring pads 63 are connected a pinched portion so as to suppress an excessive heat conduction from the wiring pads 63 to the contact pads 62 when a soldering process is performed. The contact pads 62 and the wiring pads 63 are made of a copper foil.

The above conventional printed wiring board has the following disadvantages. Since as described above the contact pad 62 as the mounting pad and the wiring pads 63 are unitary formed via the narrow portion, the total area of each of the above pads is larger than the normal mounting pad of the copper foil.

If the solders are previously applied on the mounting pads or the wiring pads 63 for subsequent bonding the electronic device 64, a large amount of the solder must be applied on the mounting pads having a larger area in order to ensure the necessary height of the solder. This results in an increased probability of bridging the solders in supplying the same. This may result in deterioration in quality of the printed wiring board.

Another problem is that after the electric device 64 has been mounted on the printed wiring board 61, the sealing resin is injected into the space between the bare chip and the printed wiring board. There is a possibility the sealing resin might flow onto the wiring pads 63 and cover the same. This prevents the provision of the wiring onto the wiring pads 63.

As the numbers of the connection pins and the connection terminals are increased, the pitch of the connection pins and the connection terminals becomes small. Therefore, the width of the contact pads 62 must be narrow. The narrow width of the contact pads 62 results in an increased probability of inadvertently disconnecting the pinched portion between the wiring pads 63 and the contact pads 62. Thereby decreasing the reliability and yield of the printed wiring board.

In the above circumstances, it had been required to develop a novel printed wiring board free from the above problems.

SUMMARY OF THE INVENTION

Accordingly, it is an object of the present invention to provide a novel printed wiring board free from the above problems.

It is a further object of the present invention to provide a novel printed wiring board which allows easy connection of wirings onto wiring contact pads provided thereon.

It is a further more object of the present invention to provide a novel printed wiring board which allows keeping a high quality of a bare chip to be bonded on the printed wiring board.

It is a further more object of the present invention to provide a novel printed wiring board which allows keeping a high yield.

The above and other objects, features and advantages of the present invention will be apparent from the following descriptions.

The present invention provides a wiring pattern extending over a printed wiring board, wherein at least an insulation layer is selectively provided on the wiring pattern so that the wiring pattern comprises at least a first region for contacting with a bump provided on a chip, at least a second region for connecting to an external wiring, and at least a third region being covered by the insulation layer and the third region separating between the first and second regions.

The present invention provides a wiring pattern extending over a printed wiring board, wherein a plurality of wirings are provided which extend radially and outwardly from a center area of the printed wiring board, and wherein each of the wirings comprises at least a bare chip mounting pad region for contacting a bump of a bare chip, at least an external wiring pad region for connecting to an external wiring, and at least a covered region being covered by at least an insulation layer and the covered region separating between the bare chip mounting pad region and the external wiring pad region.

The present invention provides a printed wiring board on which a bare chip is bonded in face-down. The printed wiring board has wiring patterns extending over the printed wiring board, wherein a plurality of wirings are provided which extend radially and outwardly from a center area of the printed wiring board, and wherein each of the wirings comprises at least a bare chip mounting pad region for contacting bumps of the bear chip, at least an external wiring pad region for connecting to an external wiring, and at least a covered region being covered by at least an insulation layer and the covered region separating between the bare chip mounting pad region and the external wiring pad region and a sealing material is filled within a space defined between the printed wiring board and the bare chip.

BRIEF DESCRIPTIONS OF THE DRAWINGS

Preferred embodiments of the present invention will be described in detail with reference to the accompanying drawings.

FIG. 3 is a fragmentary plane view illustrative of a novel printed wiring board in a first embodiment according to the present invention.

DISCLOSURE OF THE INVENTION

Figure 1:
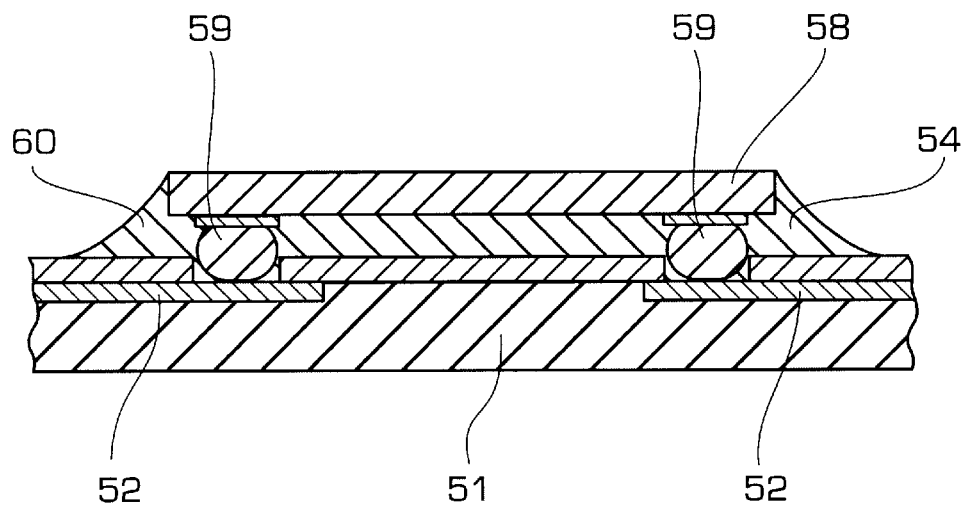
FIG. 1 is a fragmentary cross sectional elevation view illustrative of a structure of the conventional flip chip bonding.

The present invention provides a wiring pattern extending over a printed wiring board, wherein at least an insulation layer is selectively provided on the wiring pattern so that the wiring pattern comprises at least a first region for contacting with a bump provided on a chip, at least a second region for connecting to an external wiring, and at least a third region being covered by the insulation layer and the third region separating between the first and second regions.

It is preferable that the wiring pattern remains substantially unchanged in width over the first, second and third regions.

It is preferable that the wiring pattern has an expanding portion.

It is preferable that a plurality of the insulation layers are provided on a plurality of the third regions which discontinuously extend and define a plurality of the second regions separated by the third regions.

The present invention provides a wiring pattern extending over a printed wiring board, wherein a plurality of wirings are provided which extend radially and outwardly from a center area of the printed wiring board, and wherein each of the wirings comprises at least a bare chip mounting pad region for contacting a bump of a bare chip, at least an external wiring pad region for connecting to an external wiring, and at least a covered region being covered by at least an insulation layer and the covered region separating between the bare chip mounting pad region and the external wiring pad region.

It is preferable that each of the wirings remains substantially unchanged in width over the bare chip mounting pad region, the external wiring pad region and the covered region.

It is preferable that the wirings have expanding ends which are staggeringly positioned over the printed wiring board.

It is preferable that a plurality of the insulation layers are provided on a plurality of the covered regions which discontinuously extend and define a plurality of the external wiring pad regions separated by the covered regions.

It is preferable that the plurality of the insulation layers comprise a first insulation layer which extends over the center area of the printed wiring board, a second insulation layer which extends to encompass the first insulation layer and to be spaced by the bare chip mounting pad region from the first insulation layer, a third insulation layer which extends to encompass the second insulation layer and to be spaced by the external wiring pad region from the second insulation layer, and a fourth insulation layer which extends to encompass the third insulation layer and to be spaced by the external wiring pad region from the third insulation layer.

The present invention provides a printed wiring board on which a bare chip is bonded in face-down. The printed wiring board has wiring patterns extending over the printed wiring board, wherein a plurality of wirings are provided which extend radially and outwardly from a center area of the printed wiring board, and wherein each of the wirings comprises at least a bare chip mounting pad region for contacting bumps of the bare chip, at least an external wiring pad region for connecting to an external wiring, and at least a covered region being covered by at least an insulation layer and the covered region separating between the bare chip mounting pad region and the external wiring pad region and a sealing material is filled within a space defined between the printed wiring board and the bare chip.

It is preferable that each of the wirings remains substantially unchanged in width over the bare chip mounting pad region, the external wiring pad region and the covered region.

It is preferable that the wirings have expanding ends which are staggeringly positioned over the printed wiring board.

It is preferable that a plurality of the insulation layers are provided on a plurality of the covered regions which discontinuously extend and define a plurality of the external wiring pad regions separated by the covered regions.

It is preferable that the plurality of the insulation layers comprise a first insulation layer which extends over the center area of the printed wiring board, a second insulation layer which extends to encompass the first insulation layer and to be spaced by the bare chip mounting pad region from the first insulation layer, a third insulation layer which extends to encompass the second insulation layer and to be spaced by the external wiring pad region from the second insulation layer, and a fourth insulation layer which extends to encompass the third insulation layer and to be spaced by the external wiring pad region from the third insulation layer.

As described above, even after the bare chip has been bonded onto the printed wiring board, the external wiring pad region of each of the wirings is not covered by the printed wiring board but shown for allowing connecting the external wiring onto the external wiring pad region in accordance with the requirement after the bare chip was bonded.

Further, the bump is bonded in face-down via solder on the bare chip mounting pad region of each the wiring separated by the insulation layer from the external wiring pad region. The insulation layer formed on the covered region of the wiring dams a stream of solder from flowing up to the external wiring pad region. This makes it possible to supply only on the bare chip mounting pad region of each the wiring without spreading over the other region.

A plurality of the insulation layers may be provided on a plurality of the covered regions which discontinuously extend and define a plurality of the external wiring pad regions separated by the covered regions. Even after the bare chip has been bonded onto the printed wiring board, the external wiring pad regions of each of the wirings are not covered by the printed wiring board but shown for allowing connecting the external wiring onto the external wiring pad region in accordance with the requirement after the bare chip was bonded.

Each of the wirings comprises the bare chip mounting pad region for contacting bumps of the bare chip, the external wiring pad region for connecting to an external wiring, and the covered regions being covered by the first to fourth insulation layers and the covered regions separating between the bare chip mounting pad region and the external wiring pad region and the sealing material is filled within the space defined between the printed wiring board and the bare chip. The plurality of the insulation layers comprise the first insulation layer which extends over the center area of the printed wiring board, the second insulation layer which extends to encompass the first insulation layer and to be spaced by the bare chip mounting pad region from the first insulation layer, the third insulation layer which extends to encompass the second insulation layer and to be spaced by the external wiring pad region from the second insulation layer, and the fourth insulation layer which extends to encompass the third insulation layer and to be spaced by the external wiring pad region from the third insulation layer. The second, third and fourth insulation films are provided around the center region of the printed wiring board on which the bare chip is provided and the sealing resin material is filled within the space between the printed wiring board and the bare chip. The second and third insulation films serve to prevent the sealing resin material from excessively spreading to the external wiring pad region of the wirings defined between the third and fourth insulation layers. This means it possible to connect the external wiring onto the external wiring pad region without prevention by the sealing resin material.

PREFERRED EMBODIMENT

A first embodiment according to the present invention will be described with reference to FIGS. 3, 4A and 4B. FIG. 3 is a fragmentary plane view illustrative of a novel printed wiring board in a first embodiment according to the present invention. A printed wiring board 1 is provided on which a bare chip is bonded face-down. The printed wiring board 1 has a center region which is square-shaped. The bare chip is bonded on the center region of the printed wiring board 1. Wiring patterns 3 are provided which extend outwardly from a peripheral region of the square-shaped center region. For example, as illustrated in FIG. 3, a group of four or five wiring patterns extend outwardly from each side of the square-shaped center region. Each wiring pattern group extending from the square-shaped center region may include a first wiring 3a, a second wiring 3b and a third wiring 3c. The first wiring 3a has an expanding portion at an inside end, the third wiring 3c has an expanding portion at an outside end. The second wiring 3b has a uniform width. A first insulation film 4a is provided over the square-shaped center region of the printed wiring board 1. A second insulation film 4b encompasses the first insulation film 4a and is spaced therefrom by a bare chip mounting pad 2. A third insulation film 4c encompasses the second insulation film 4b and is spaced therefrom by a first pad 6. A fourth insulation film 4d encompasses the third insulation film 4c and to is spaced therefrom by a second wiring pad. Since the wirings have uniform widths, except for the expanding portion, bare chip mounting pad 2, the first wiring pad 6 and the second wiring pad 7 have the same width.

Figure 4B:
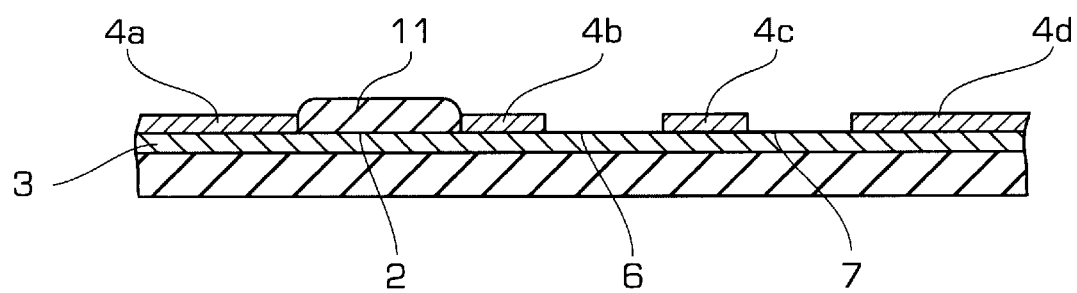
FIG. 4B is a fragmentary cross sectional elevation view illustrative of the printed wiring board in a first embodiment according to the present invention.
Figure 2A:
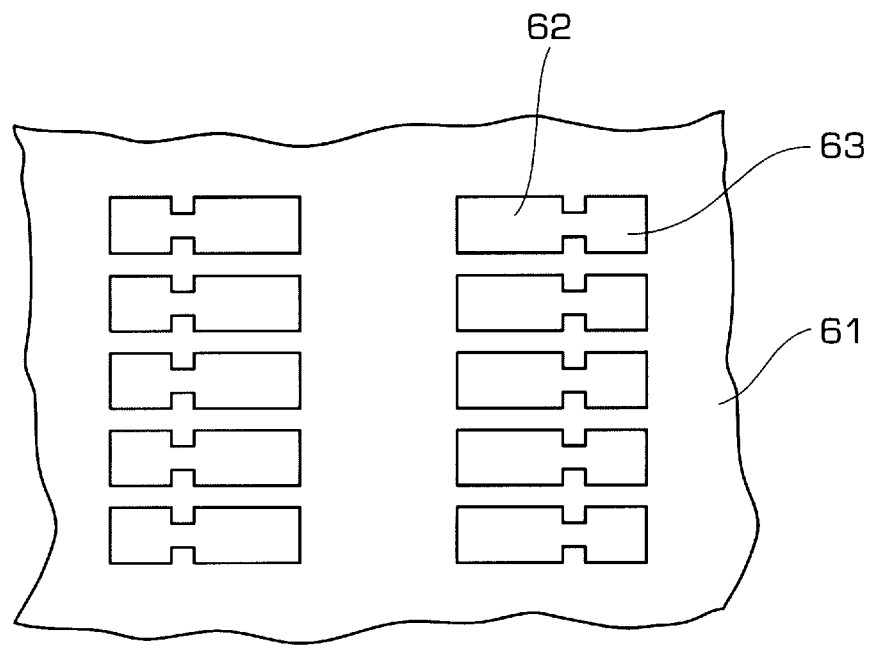
FIG. 2A is a plane view illustrative of the printed wiring board.
Figure 2B:
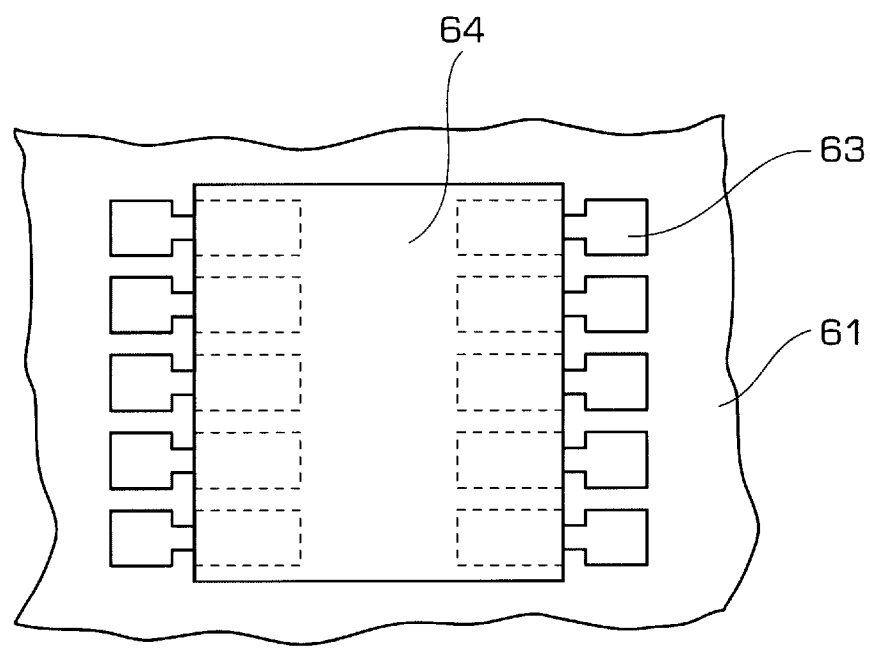
FIG. 2B is a plane view illustrative of the printed wiring board on which an electronic device is mounted.
Figure 4A:
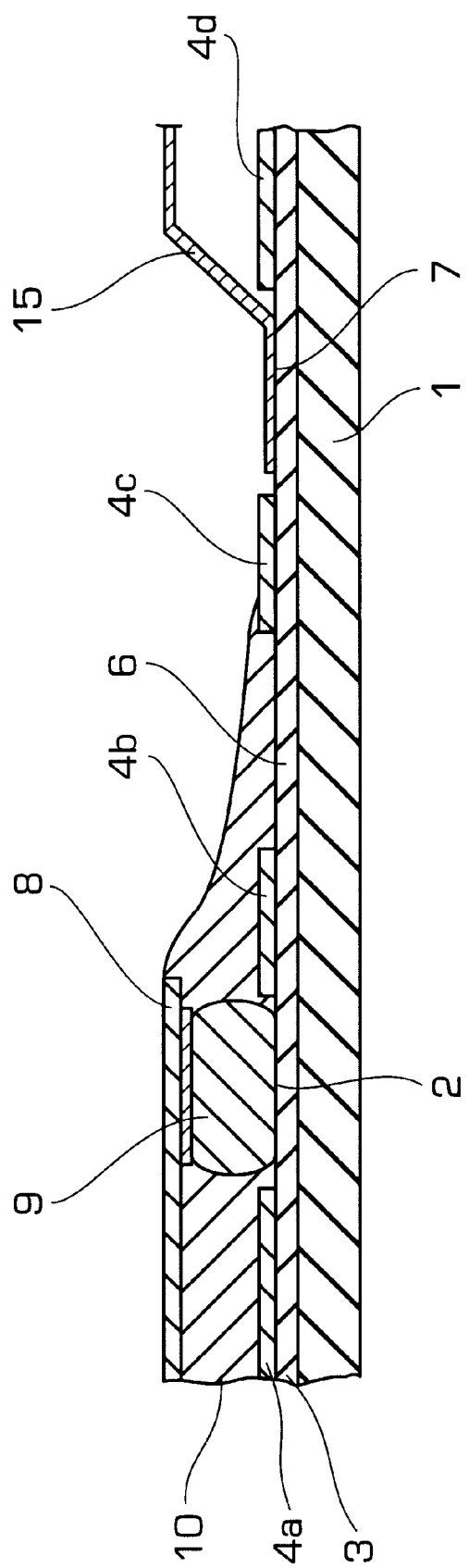
FIG. 4A is a fragmentary cross sectional elevation view illustrative of the printed wiring board on which the bare chip is bonded in face-down in a first embodiment according to the present invention.

FIG. 4A is a fragmentary cross sectional elevation view illustrative of the printed wiring board on which a wiring is provided. A bump 9 of the bare chip 8 is bonded to the bare chip mounting pads. The first wiring pad 6 and the second wiring pad 7 are positioned outside the center region of the printed wiring board 1 on which the bare chip 8 is bonded in face-down. The second insulation film 4b and the third insulation film 4c are also positioned outside the center region of the printed wiring board 1. A sealing resin 10 is filled within the space defined between the printed wiring board 1 and the bare chip 8. The second insulation film 4b and the third insulation film 4c dam a stream of the sealing resin 10 from flowing to the second wiring pad 7. This allows a wiring jumper line 15 to be connected to the second wiring pad 7.

FIG. 4B is a fragmentary cross sectional elevation view illustrative of the printed wiring board. A bump 11 is applied on the bare chip mounting pad 2. The bump 11 may be restricted by the first insulation film 4a and the second insulation film 4b and prevented from being spread to other region.

Figure 5:
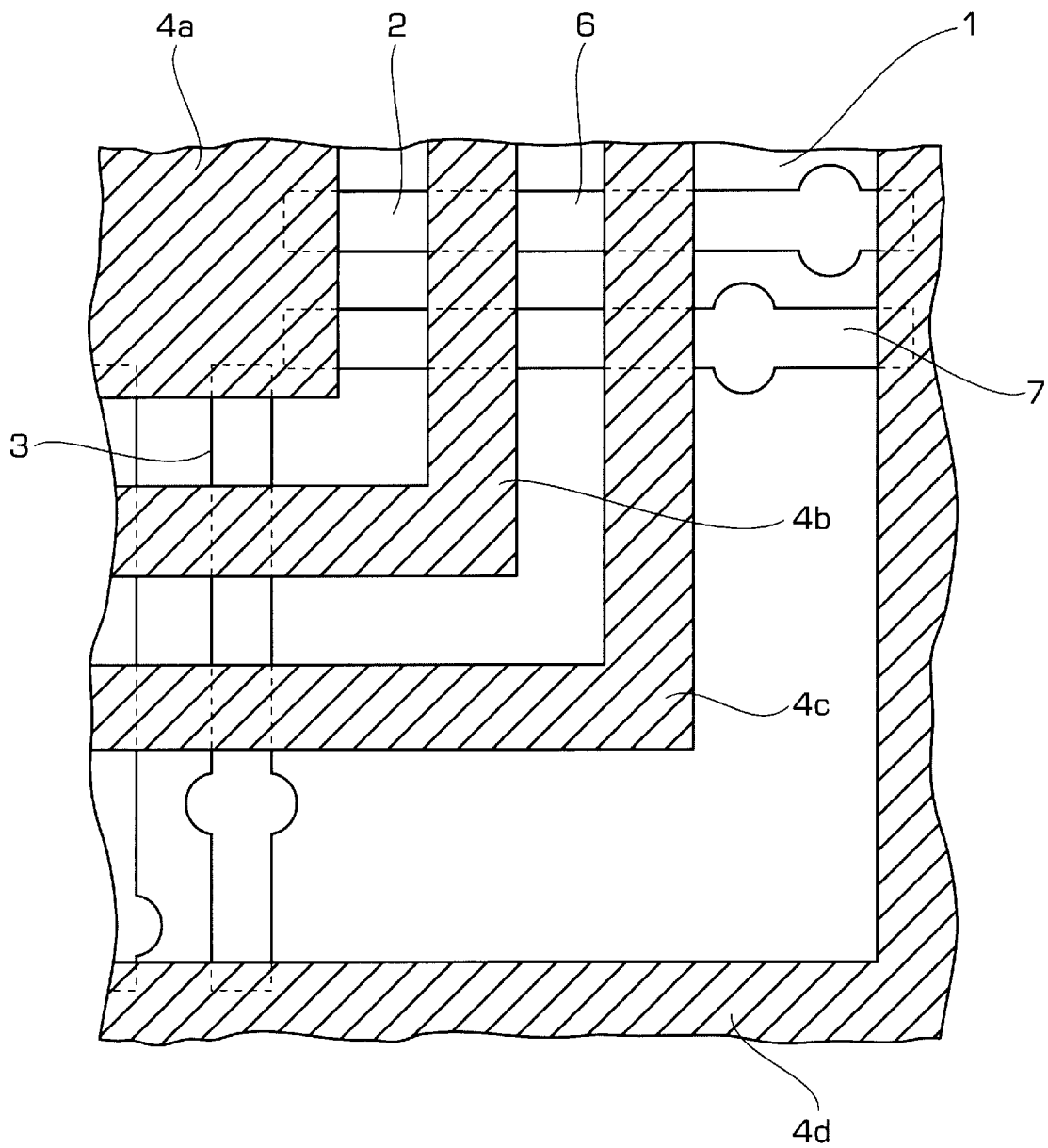
FIG. 5 is a fragmentary enlarged plane view illustrative of a printed wiring board in a second embodiment according to the present invention.

A second embodiment according to the present invention will be described with reference to FIG. 5 which is a fragmentary enlarged plane view illustrative of a printed wiring board in a second embodiment according to the present invention. A printed wiring board 1 is provided on which a bare chip is bonded face-down. The printed wiring board 1 has a center region which is square-shaped. The bare chip is bonded on the center region of the printed wiring board 1. Wiring patterns 3 are provided which extend outwardly from a peripheral region of the square-shaped center region. A first insulation film 4a is provided over the square-shaped center region of the printed wiring board 1. A second insulation film 4b extends to encompasses the first insulation film 4a is spaced therefrom by a bear chip mounting pad 2. A third insulation film 4c encompasses the second insulation film 4b and to be spaced therefrom by a first wiring pad 6. A fourth insulation film 4d encompasses the third insulation film 4c and is spaced therefrom by a second wiring pad 7. The second wiring pad 7 has an expanding portion which is semi-circular shaped. The expanding portions of the second wiring pads 7 are staggeringly positioned as illustrated in FIG. 5 so as to shorten the pitch of the wirings without causing an electrical short circuit. The expanding portions ensure large contact areas for connecting the external wirings. This makes it easy to connect the external wirings onto the second wiring contact pads 7 and also allows keeping high quality and reliability of the printed wiring board.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A wiring pattern of a printed wiring board, comprising:
   a wiring extending along a surface of said printed wiring board, said wiring having an exposed first region for contacting with a bump provided on a chip, and an exposed second region for connecting to an external wiring, and a third region interposed between said exposed first region and said exposed second region; and an insulation layer disposed on said third region to provide a barrier between said exposed first region and said exposed second region.

2. The wiring pattern as claimed in claim 1, wherein said wiring has a substantially uniform width.

3. The wiring pattern as claimed in claim 1, wherein said wiring has an expanded width portion.

4. The wiring pattern as claimed in claim 1, wherein said wiring has a plurality of exposed second regions separated by a plurality of third regions, said insulation layer provided on each of said plurality of third regions.

5. The wiring pattern as claimed in claim 1, wherein said exposed first region, said exposed second region, and said third region are provided in a single plane.

6. The wiring pattern as claimed in claim 1, wherein said insulation layer projects from a plane defined by one of said exposed first region and said exposed second region.

7. A wiring pattern extending over a printed wiring board, comprising:

a plurality of wirings extending outwardly from a center area of said printed wiring board, each of said plurality of wirings having a bare chip mounting pad for contacting a bump of a bare chip, a wiring pad for connecting to an external wiring, and a region interposed between said bare chip mounting pad and said wiring pad; and an insulation layer provided on said covered region.

8. The wiring pattern as claimed in claim 7, wherein each of said plurality of wirings has a substantially uniform width over said bare chip mounting pad, said external wiring pad and said region.

9. The wiring pattern as claimed in claim 7, wherein said plurality of wirings have ends with expanded widths which are staggeringly positioned over said printed wiring board.

10. The wiring pattern as claimed in claim 7, wherein each of said plurality of wirings has a plurality of wiring pads separated by a plurality of regions, and said insulation layer is provided on said plurality of covered regions.

11. The wiring pattern as claimed in claim 10 wherein said insulation layer is selectively disposed on said printed wiring board and comprises:

a first insulation region covering said center area of said printed wiring board;

a second insulation region encompassing said first insulation region and spaced therefrom, such that said bare chip mounting pad of each of said plurality of wirings is exposed between said first and said second insulation regions;

a third insulation region encompassing said second insulation region and spaced therefrom, such that one of said plurality of wiring pads of each of said plurality of wirings is exposed between said second and said third insulation regions; and a fourth insulation region encompassing said third insulation region and spaced therefrom, such that another one of said plurality of wiring pads of each of said plurality of wirings is exposed between said third and said fourth insulation regions.

12. A printed wiring board on which a bare chip is bonded, said printed wiring board having a center area over which said bare chip is superimposed, said printed wiring board comprising:

a plurality of wirings extending outwardly from said center area of said printed wiring board, each of said plurality of wirings having a bare chip mounting pad for contacting bumps of the bare chip, a wiring pad for connecting to an external wiring, and a region interposed between said bare chip mounting pad and said external wiring pad;

an insulation layer provided on said covered region of each of said plurality of wirings; and a sealing material disposed within a space defined between said printed wiring board and said bare chip.

13. The printed wiring board as claimed in claim 12, wherein each of said plurality of wirings is substantially uniform in width.

14. The printed wiring board as claimed in claim 12, wherein said plurality of wirings have ends with expanded widths which are staggeringly positioned over said printed wiring board.

15. The printed wiring board as claimed in claim 12, wherein each of said plurality of wirings has a plurality of wiring pads separated by a plurality of covered regions, and said insulation layer is provided on said plurality of covered regions.

16. The printed wiring board as claimed in claim 15, wherein said insulation layer is selectively disposed on said printed wiring board and comprises:

a first insulation region covering said center area of said printed wiring board;

a second insulation region encompassing said first insulation region and spaced therefrom, such that said bare chip mounting pad of each of said plurality of wirings is exposed between said first and said second insulation regions;

a third insulation region encompassing said second insulation region and spaced therefrom, such that one of said external wiring pads of each of said plurality of wirings is exposed between said second and said third insulation regions; and a fourth insulation region encompassing said third insulation region and spaced therefrom, such that another one of said plurality of wiring pads of each of said plurality of wirings is exposed between said third and said fourth insulation regions.

* * * * *

UNITED STATES PATENT AND TRADEMARK OFFICE
CERTIFICATE OF CORRECTION

PATENT NO.  : 5,925,445
DATED       : July 20, 1999
INVENTOR(S) : Motoji SUZUKI

It is certified that error appears in the above-identified patent and that said Letters Patent is hereby corrected as shown below:

Col. 1, line 49, after "connected" insert --via--.

Col. 6, line 3, after "pad" insert --7--.

Signed and Sealed this

Twenty-first Day of December, 1999

*Attest:*

Q. TODD DICKINSON

*Attesting Officer*    Acting Commissioner of Patents and Trademarks